United States Patent [19]

Burkum et al.

[11] 4,425,541
[45] Jan. 10, 1984

[54] APPARATUS FOR IDENTIFYING DEFECTIVE ELECTRIC POWER DISTRIBUTION CAPACITORS

[75] Inventors: Merlin E. Burkum, Elmhurst; Timothy M. O'Regan, Chicago, both of Ill.

[73] Assignee: Commonwealth Edison Co., Chicago, Ill.

[21] Appl. No.: 301,949

[22] Filed: Sep. 14, 1981

[51] Int. Cl.³ ............................................ G01R 31/02
[52] U.S. Cl. .................................... 324/51; 324/60 C
[58] Field of Search ..................... 324/51, 60 C, 117 H

[56] References Cited
FOREIGN PATENT DOCUMENTS 902057  8/1945  France .............................. 324/60 C

OTHER PUBLICATIONS

Oliver et al.; "Electronic Measurements and Instrumentation"–(p. 279)–McGraw–Hill–1972.

Primary Examiner—Stanley T. Krawczewicz
Assistant Examiner—Jose M. Solis
Attorney, Agent, or Firm—Emrich, Lee, Brown & Hill

[57] ABSTRACT

An apparatus for determining the operating condition of capacitors of the type used for power factor correction on electric distribution systems is assembled in two sections. A first power supply device supplies an alternating electric current to a de-energized capacitor without removing it from its installed position and a second power measurement device, utilizing a split-core Hall-device, measures the magnitude of the electric current entering the capacitor being tested.

5 Claims, 3 Drawing Figures

U.S. Patent
Jan. 10, 1984
4,425,541
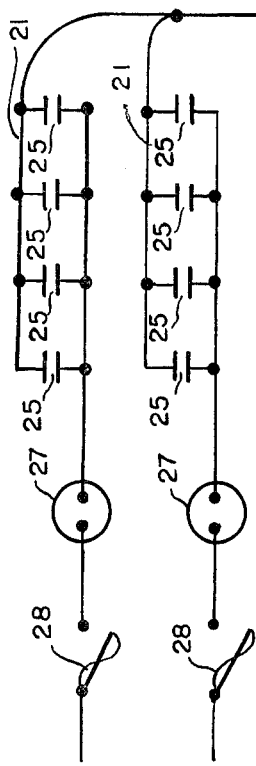
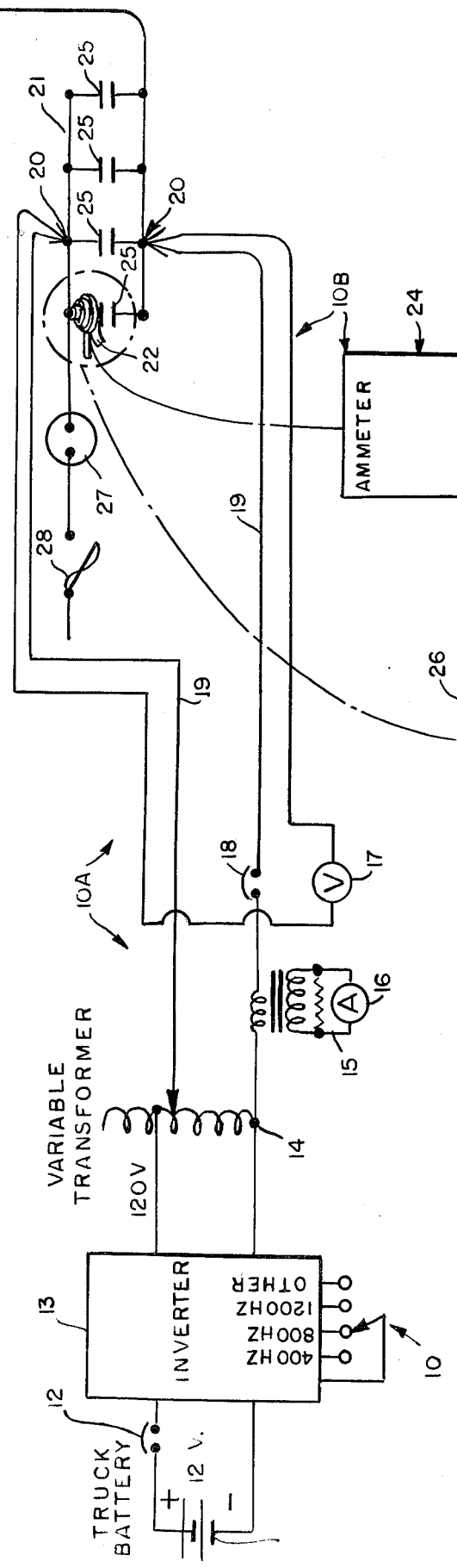
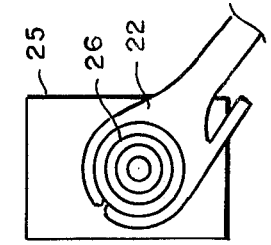
FIG. 1
FIG. 2
FIG. 3

APPARATUS FOR IDENTIFYING DEFECTIVE ELECTRIC POWER DISTRIBUTION CAPACITORS

BACKGROUND OF THE INVENTION

The present invention relates to an apparatus for the in-circuit detection of defective capacitors of the type used on electric power distribution systems.

The shunt connected high voltage distribution type capacitor units are used extensively by the electric utility industry and manufacturing industry in their electrical supply systems for correcting the power factor of the system and maintaining voltage levels. A common method of construction of these capacitors consists of two sheets of pure aluminum foil separated by layers of kraft paper or plastic film impregnated with chromated aromatic hydrocarbon compounds. A capacitor unit is made up of several of these individual small sized capacitor packs or rolls which are connected in a parallel-series arrangement in order to obtain the desired capacitance value and withstand the high voltages in the range of 2000 volts to 20,000 volts. Before the capacitor unit is enclosed in a sealed metal can, having two insulated bushing-type terminals extending from the top, the metal can is filled with an insulating flammable liquid. Before 1977, most capacitor units contained PCB-type insulating fluids. However, such materials have been condemned because of toxicity and environmental problems. These capacitor units are connected to the distribution line at various locations close to the load centers and are installed singly or in parallel banks of two, three or four per line phase. Generally, only one fuse is employed to clear a bank of 2, 3 or 4 capacitor units, should an electrical short to ground occur on one of the capacitor unit cans.

It is important that as many of the capacitor units as possible in an electric distribution system be in a serviceable condition so that during periods of high electrical load the system voltage is held within an acceptable range. However, because of periodic failures and bank fusing, at any given time there may be a large number of capacitor units disconnected from the system and awaiting service. In order to compensate for these failed capacitor units, either a surplus of capacitor units over and above the minimum necessary is required, or the generators must supply the additional reactive power at the expense of producing real power. In either case, the result is an unacceptable additional monetary expense.

Prior to the present invention, detection of failed capacitor units by electric utility linemen has been primarily that of a visual observation. A blown fuse is one signal to a lineman that a bank of capacitor units is out of service. One or more of the capacitor units may be defective, or possibly the fuse was blown for a reason other than a shorted capacitor. If the lineman cannot visually detect a sign of failure, such as a bulged metal can or a leaking seam or bushing, the operating practice has been to re-energize the bank of capacitors with a new fuse.

The above practice has very serious drawbacks and limitations. First, should the capacitor bank be re-energized when a capacitor unit actually has an electrical short, for which not visual indication is apparent, there is the increased possibility of a violent rupture and release of the dielectric fluid onto the immediate area. Containment of the liquid dielectric fluid within the capacitor can is very important because the capacitor units containing PCB-type insulating fluids must not be allowed to contaminate the immediate area.

Secondly, a capacitor unit may have a partial or incipient fault because one of the small series of connected packs, making up the total capacitor unit, has shorted or opened. The capacitor unit may withstand the applied distribution line voltage for a short time, perhaps hours or weeks, by a redistribution of the line voltage across the remaining operative series connected capacitor packs. However, arcing by the faulty capacitor pack can cause the dielectric fluid and insulation to decompose into hydrocarbon gases, bulging the capacitor can and creating a potentially explosive condition when the eventual electrical failure of the capacitor unit occurs.

There have been several suggested methods and apparatuses for determining the condition of a capacitor unit, however, these suggestions all require operations which are normally beyond the assigned duties and technical capabilities of the average lineman. For example, the USA Standards for Shunt Power Capacitors 0551-1968 describes various field tests for these type capacitor units. One such test requires the application of a known voltage and frequency of undistorted wave shape to the capacitor unit. However, this test of capacitance measurement requires disconnecting each capacitor unit from the remainder of the bank and then individually measuring the current drawn by each unit. Such tests require a high degree of technical competence to interpret the resultant meter readings and the manpower cost associate with such tests are prohibitive. Moreover, the disconnecting and handling of the capacitor unit can cause damage to the capacitor unit which results in incipient faults.

Also, commercially available capacitance meters, which apply a low AC voltage to provide a direct capacitance reading of the capacitor are unreliable on paper film capacitors. The gases created by arcing in a defective unit insulates the defective pack and capacitance readings obtained may be in error. Use of this device requires also disconnecting each unit in the capacitor bank during testing, which results in large manpower costs and expensive time loss during testing.

Lastly, the methods of determining the condition of a capacitor by measuring the current thru the capacitor by ordinary split-magnetic core type ammeters are neither sensitive to nor sufficiently shielded from the ambient electric and magnetic fields of the adjacent electric distribution lines to provide the necessary accurate readings to determine the condition of a capacitor unit. Accordingly, the measurement of the charging current to a specified single capacitor connected in parallel with similar capacitors utilizing an ordinary clamp-on type ammeter results in inaccuracies, due to the surrounding electrical and magnetic fields, which are unacceptable for determining the good/no good condition of that capacitor.

SUMMARY OF THE INVENTION

It is one object of the present invention to accurately determine the operating condition of a multipack, high-voltage capacitor unit of the type used in electric power distribution systems.

It is another object of the present invention to accurately detect incipient-type faults in multipack capacitor units of the type used in electric distribution systems.

It is still another object of the present invention to present a simplified operating method for the accurate determination and detection of the condition of a capacitor unit which may be readily understood by non-technical distribution system operating personnel.

It is a further object of the present invention to accurately determine the operating condition of a multipack, high-voltage capacitor unit in the presence of electric and magnetic fields normally present at power capacitor bank installation.

It is still a further object of the present invention to allow the determination and detection of the condition of each multipack capacitor unit connected in parallel with two or more similar units without disconnecting the paralleled units from one another.

And, one more object of the present invention is to provide for the safe, self-powered operation of the fault detection assembly and procedure for the detection of the condition of a multipack capacitor unit at the installation site.

The present invention, although seemingly simple and straightforward in basic principles, is in reality a carefully coordinated assembled combination of electrical components which match the simplified testing requirements for correctly assessing the operating condition of electrical distribution power-type capacitors in the environment of large electrical and magnetic fields present at power capacitor bank installations used in electric power distribution systems.

The power capacitor tester assembly is comprised of a transmitter section and a measurement section. The transmitter section consists of a power source or storage battery, an input circuit breaker, a DC/AC inverter having voltage and frequency regulation, an auto-transformer adjustable from 0 to 140 volts, a current measurement circuit, an output circuit breaker, an output voltmeter, and electrical conductors to connect the electrical output of the inverter to the power capacitor unit to be tested. The receiver section consists of a split-magnetic core probe which utilizes the Hall-effect to produce a current which is measured by a current meter circuit.

The operation of the power capacitor tester assembly is described as follows. The storage battery, normally a 12 volt truck battery, is the energy source for a 12 volt DC to 120 volt AC inverter. The inverter has a normal 400 hertz output signal, but through a frequency doubling or tripling circuiting, or separate oscillators, is adapted to produce higher frequencies such as 800 or 1200 hertz. The 120 volt output from the inverter is fed into the variable transformer connected to the capacitor or bank of capacitors to be tested. The split-core, Hall-type probe is preferably positioned and centered about the phase bushing of the capacitor, and the electric current on the ammeter is read as the voltage from the variable transformer is increased. However, it is within the scope of the present invention to position the Hall-type probe around any lead exiting the capacitor provided the Hall-type probe is properly centered thereto.

With the capacitor bank energized at the test voltage, the current meter and clamp-type Hall probe is positioned about any lead exiting the capacitor and the current taken by each individual capacitor is determined. The readings are compared with a chart of acceptable values. A reading lower than an acceptable current indicates that there is an open circuit between the capacitor packs within the unit-can. A reading higher than an acceptable current indicates either a shorted capacitor pack within the unit or possibly a leakage path to ground. For either the high or low current readings, a probable incipient fault is indicated and the capacitor unit should be replaced.

Importantly, the 120–240 volt output from the variable transformer is the minimum required to assure that there is a sufficient test potential across each of the individual capacitor packs making up the capacitor unit. Higher potentials only serve to lessen the margin of safety to the operating personnel.

At the 120–240 volt safe level, an ordinary 60 hertz source does not furnish sufficient charging current to the capacitor to be readily measured accurately. Therefore, the 400/800 hertz current furnished by the 12VDC–120/240VAC inverter fulfills the accuracy needed without the sacrifice of safety, as will hereinafter be described.

BRIEF DESCRIPTION OF THE DRAWINGS

FIG. 1 is a schematic diagram illustrating the components of the power capacitor tester and the method of attachment to the power capacitor for testing in accordance with the present invention;

FIG. 2 is an enlarged perspective view showing the positioning of the split-core, Hall-type probe about the phase bushing of the capacitor in accordance with the present invention; and FIG. 3 is a top plan view showing the positioning of the split-core, Hall-type probe about the phase bushing of the capacitor in accordance with the present invention.

DETAILED DESCRIPTION

Referring now to FIG. 1, the power capacitor tester assembly or apparatus 10 is comprised of a transmitter section 10A and a measurement section 10B. The transmitter section 10A includes a power source or storage battery 11, an input circuit breaker 12, a DC/AC power source or inverter 13, possessing precise voltage and frequency regulation, an auto-transformer 14 adjustable from 0 to 140 volts, a current measurement circuit 15, an output circuit breaker 18, an output voltmeter 17 and electrical conductors 19 to connect the electrical output of the inverter 13 to the power capacitor bank 21 to be tested. The receiver section 10B consists of a split-magnetic core probe element 22 which utilizes the Hall-effect to produce and amplify a current which is measured by a current meter circuit device 24. One example of an acceptable Hall-type probe is the F.W. Bell Digital Current Meter Model 1776.

The operation of the power capacitor testerapparatus may be described as follows: The storage battery 11, normally a 12 volt battery, is the energy source for a 12 volt DC current which is directed to the 120 volt AC inverter 13. The inverter 13 has a normal 400 hertz output signal, but through a frequency doubling or tripling circuiting, or separate oscillators, the inverter may produce higher frequencies, such as 800 or 1200 hertz. The 120 volt output from the inverter 13 is directed into a variable transformer 14, the output of which is connected to the capacitor 25 or bank of capacitors 21 to be tested. The split-core, Hall-type probe or device 22 is preferably positioned and centered about the phase bushing 26 (FIGS. 2 and 3) on the individual capacitor 25 in the power capacitor bank 21 and the electric current on the current meter or ammeter 24 is read, as the voltage from the variable transformer 14 is increased and, it is preferable that the Hall-type prove or device 22 and the current meter 24 have a sensing range from 0 to 10 amperes. However, it is within the scope of the present invention to position the Hall-type device 22 around any lead exiting the capacitor provided the Hall-type probe is properly centered thereto.

For each capacitor unit rating, there is an acceptable range of amperes at the exact output voltage, normally 120 volts for which the capacitor is deemed acceptable. The suggested output voltages and the acceptable range of amperes for various capacitor can sizes or ratings are given in the Table I set forth below:

TABLE I
CURRENT METER READINGS

| CAPACITOR NAMEPLATE VOLTAGE 7200 V. | | CAPACITOR NAMEPLATE VOLTAGE 2400 V. | |
|---|---|---|---|
| CAN SIZE (KVAR) | CURRENT RANGE AT 120 V. | CAN SIZE (KVAR) | CURRENT RANGE AT 50 V. |
| 50 | .655–.808 | 15 | .769–.927 |
| 100 | 1.46–1.76 | 25 | 1.32–1.58 |
| 150 | 2.28–2.79 | 50 | 2.82–3.45 |
| 200 | 3.02–3.70 | 100 | 6.00–7.20 |
|  |  | 150 | 8.94–10.7 |

One suggested test procedure for testing a bank of capacitors installed on an electric distribution pole utilizing an overhead line crew having a truck equipped with an aerial bucket may be described as follows:

The truck has an aerial bucket (not shown) which is used to lift a lineman into position next to the capacitor bank 21. The lineman carries with him the power leads 19 and a digital current meter 24. The lineman first disconnects the three phase capacitor bank 21 from the high voltage line by opening the line switches 27 and capacitor fuse protectors 28 as provided. After waiting five minutes for the capacitor bank 21 to discharge through their internal resistors, a temporary ground is applied to ensure that no charge remains on the capacitor bank 21. Next, the ground is removed and the test circuit 10A is connected to the single phase capacitor bank 21 by means of cable 19 and the clamps 20. The truck operator energizes the inverter 13 by means of the input breaker 12 and then adjusts the variable transformer 14 while he reads the test voltage on the voltmeter 17 while also observing the ammeter 16.

With the capacitor bank 21 energized at the test voltage, the lineman positions the Hall-type probe 22 about the phase bushing 26 (FIGS. 2 and 3) and uses the current meter 24 to read the current taken by each individual capacitor 25. The readings are compared with a chart depicted in Table I of acceptable values. A lower than acceptable current indicates that there is an open circuit between the capacitor packs within the capacitor unit can 25. A higher than acceptable current indicates either a shorted capacitor pack within the capacitor unit 25 or possibly a leakage path to ground. For either the high or low current readings, a probable incipient fault is indicated and the capacitor 25 should be replaced.

Importantly, where there is insufficient current sensitivity because of testing small capacitors 25, the sensitivity can be increased by increasing the output frequency or voltage, as desired.

Generally, the 120–240 volt output from the variable transformer 14 is the minimum required to assure that there is a sufficient test potential across each of the individual capacitor packs making up the capacitor unit 25. Higher potentials only serve to lessen the margin of safety to the operating personnel. At the 120–240 volt safe level, an ordinary 60 hertz source does not furnish sufficient charging current to the capacitor to be readily measured accurately. Therefore, the 400/800 hertz current furnished by the 12VDC–120/240VAC inverter 13 fulfills the accuracy needed without the sacrifice of safety.

It will be seen that the present invention affords a novel apparatus for identifying defective electric power distribution capacitors which is practical and efficient in operation and which may be readily applied by average lineman. Further, the present invention is self-powered and may be transported easily to test sites. Moreover, the apparatus allows tests to be performed on the capacitor units 25 without disconnecting the units 25 from one another.

Thus, while I have illustrated and described the preferred embodiment of my invention, it is to be understood that this is capable of variation and modification, and I, therefore, do not wish to be limited to the precise details set forth, but desired to avail myself of such changes and alterations as fall within the purview of the following claims.

What is claimed is:

1. An apparatus for detecting incipient faults in a power capacitor having:
   an alternating current power source including a storage battery having an output of between 12 and 24 volts and an inverter having an input of between 12 and 24 volts D.C. and an output of 120 volts at a frequency of 400 hertz;
   a variable transformer for varying the output voltage of the said power source;
   connecting means for supplying alternating output voltage of said variable transformer to the power capacitor to be tested;
   a voltmeter for measuring magnitude of output voltage of said variable transformer at the capacitor to be tested;
   an open and closed type, split magnetic core probe utilizing the Hall-effect for sensing and amplifying the charging current from the output of said variable transformer which enters the capacitor being tested; and
   an ammeter for indicating the magnitude of the current output from said Hall-effect device.

2. The apparatus as recited in claim 1 wherein the output frequency of said inverter is doubled to 800 hertz (through the action of a frequency doubling circuit).

3. The apparatus as recited in claim 1 wherein said variable transformer has an input rating of 120 volts at 400 to 800 hertz and an output voltage variable from 0 to 140 volts.

4. The apparatus as recited in claim 1 wherein said varible transformer has an input rating of 120 volts at 400 to 800 hertz at an output voltage variable from 0 to 240 volts.

5. The apparatus as recited in claim 1 wherein said Hall-type probe and said ammeter have a sensing range from 0 to 10 amperes.

* * * * *